(12) United States Patent
Kaizu et al.

(10) Patent No.: US 10,148,474 B2
(45) Date of Patent: Dec. 4, 2018

(54) RECEIVING DEVICE AND RECEIVING METHOD, AND TRANSMITTING/RECEIVING SYSTEM

(71) Applicant: Mitsubishi Electric Corporation, Tokyo (JP)

(72) Inventors: Aki Kaizu, Tokyo (JP); Masataka Imao, Tokyo (JP); Eiji Matsuo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/513,889

(22) PCT Filed: Jul. 31, 2015

(86) PCT No.: PCT/JP2015/071841
§ 371 (c)(1),
(2) Date: Mar. 23, 2017

(87) PCT Pub. No.: WO2016/075966
PCT Pub. Date: May 19, 2016

(65) Prior Publication Data
US 2017/0288924 A1 Oct. 5, 2017

(30) Foreign Application Priority Data
Nov. 13, 2014 (JP) .................... 2014-230255

(51) Int. Cl.
*H04L 27/22* (2006.01)
*H04L 25/49* (2006.01)
(Continued)

(52) U.S. Cl.
CPC ............... *H04L 27/22* (2013.01); *H03L 7/08* (2013.01); *H04B 1/0007* (2013.01);
(Continued)

(58) Field of Classification Search
CPC ..... H04L 25/4902; H04L 27/22; H04B 14/02; H04B 14/026; H04B 1/0007; H03K 7/04; H03K 9/04; H03L 7/08
(Continued)

(56) References Cited

U.S. PATENT DOCUMENTS 5,691,665 A 11/1997 Ohtani
2004/0141568 A1* 7/2004 Huat ................. H04L 25/03012
375/295

(Continued)

FOREIGN PATENT DOCUMENTS

JP 6-6397 A 1/1994
JP 9-98193 A 4/1997
(Continued)

*Primary Examiner* — Kevin M Burd
(74) *Attorney, Agent, or Firm* — Birch, Stewart, Kolasch & Birch, LLP

(57) ABSTRACT

A receiving device includes: a receiver that receives a signal including PPM symbols; a clock generator that generates a clock for sampling; an A/D converter that digital-converts the received signal; a reference position detector that detects a leading position of the PPM symbols based on data from the A/D converter; and a clock error detector that detects a clock error. The clock error detector includes: a pulse position detector that detects a pulse position in the PPM symbols based on data from the reference position detector and A/D converter; a position error calculator that calculates a deviation of the pulse position based on data from the reference position detector, A/D converter, and pulse position detector; and a clock error calculator that calculates the clock error based on data from the position error calculator. The receiving device varies a frequency of the clock based on data from the clock error calculator.

8 Claims, 16 Drawing Sheets

(51) Int. Cl.
    *H03L 7/08* (2006.01)
    *H04B 1/00* (2006.01)
    *H04L 7/00* (2006.01)
    *H04L 7/04* (2006.01)
(52) U.S. Cl.
    CPC .............. *H04L 7/0066* (2013.01); *H04L 7/04* (2013.01); *H04L 25/49* (2013.01)
(58) Field of Classification Search
    USPC .................................................. 375/239, 340
    See application file for complete search history.

(56) References Cited

U.S. PATENT DOCUMENTS

| 2004/0186937 | A1* | 9/2004 | Jonsson | G07D 5/00 |
| | | | | 710/72 |
| 2011/0129039 | A1* | 6/2011 | Yamazaki | H04L 7/0331 |
| | | | | 375/322 |

FOREIGN PATENT DOCUMENTS

| JP | 10-84337 A | 3/1998 |
| JP | 2001-186113 A | 7/2001 |
| JP | 2006-13994 A | 1/2006 |
| JP | 2006-211510 A | 8/2006 |
| JP | 2009-44464 A | 2/2009 |
| JP | 2014-36245 A | 2/2014 |

* cited by examiner

There is no clock error.

There is a clock error
(short symbol clock error).

There is a clock error
(long symbol clock error).

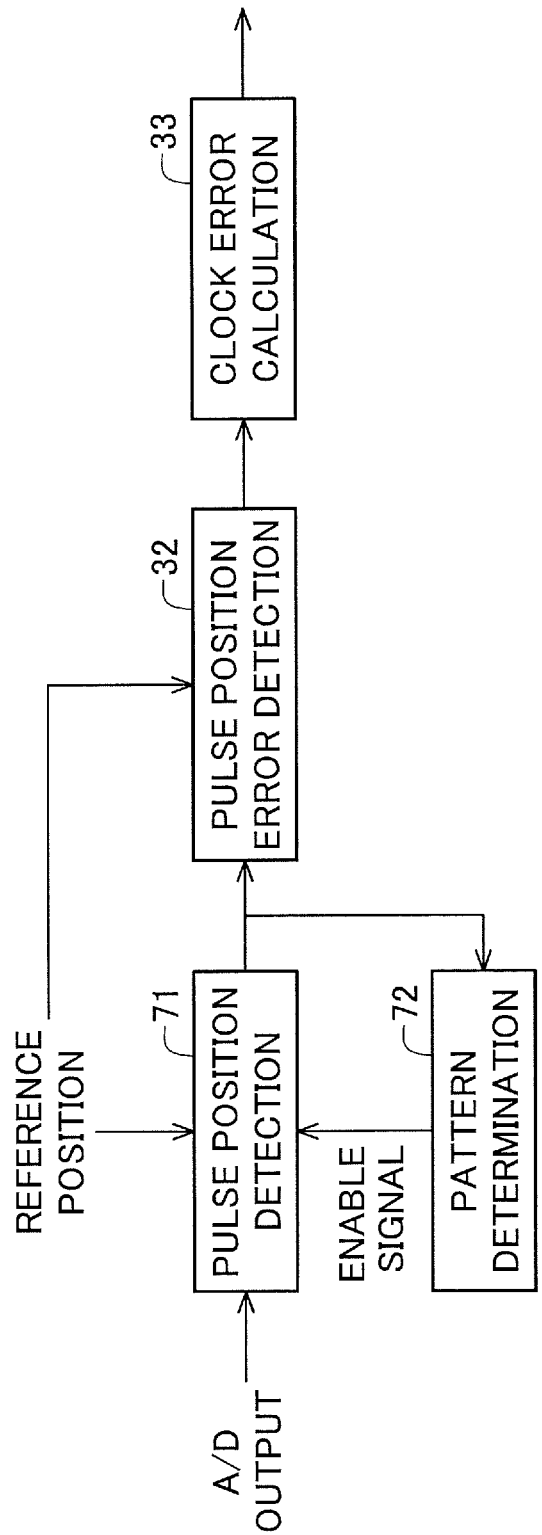

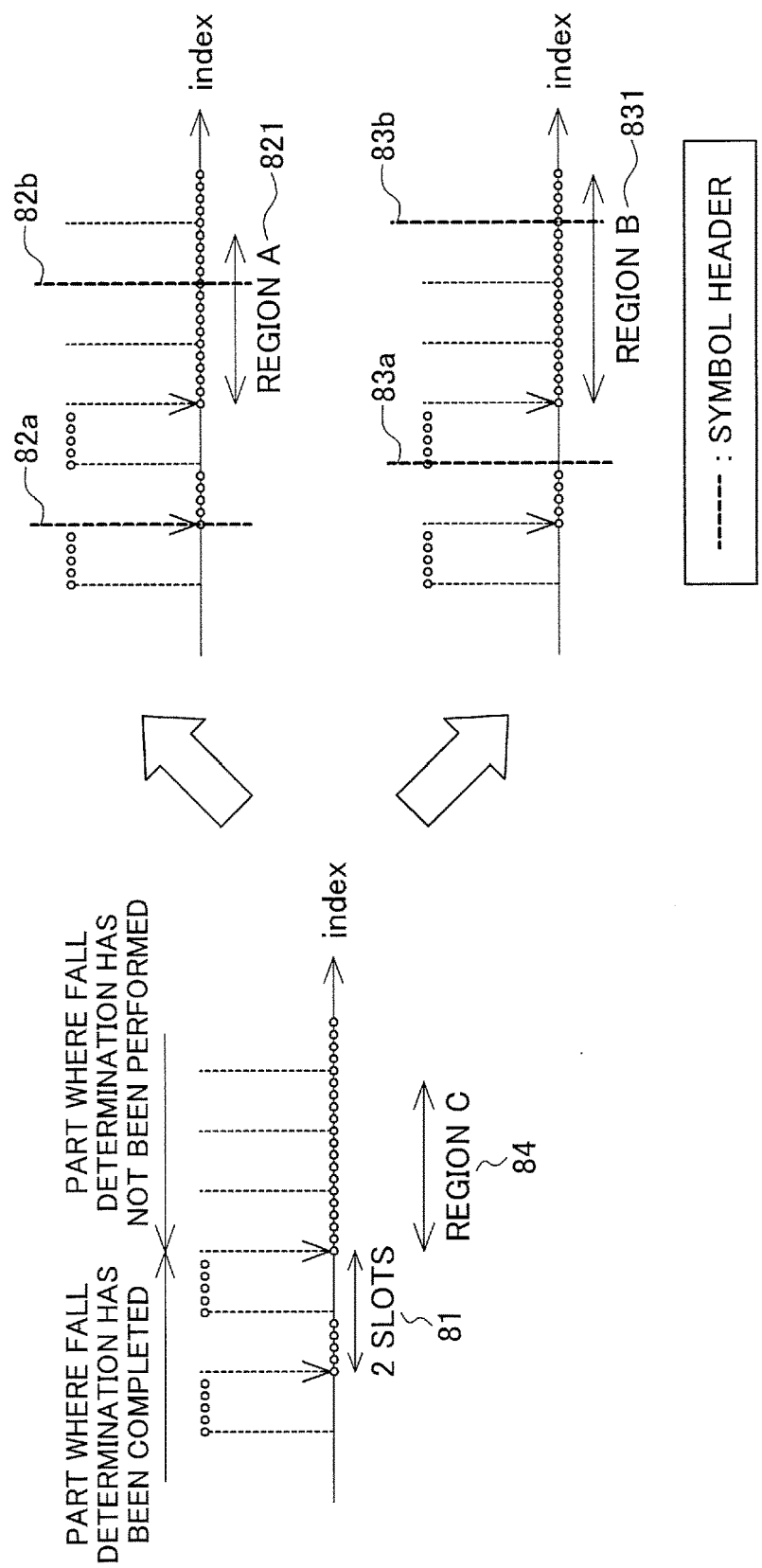

RECEIVING DEVICE AND RECEIVING METHOD, AND TRANSMITTING/RECEIVING SYSTEM

TECHNICAL FIELD

It relates to a signage system that receives data transmitted using pulse position modulation (PPM) and displays an advertisement, and more particularly, to a receiving device and a receiving method therefor.

BACKGROUND ART

In advertisements on straps provided in cars of public transportation, such as trains or buses, some advertisements, which have conventionally been displayed using paper media, have recently been displayed using flat-panel displays, such as liquid crystal panels or electro-luminescence (EL) displays. In such strap signage systems, there is a demand for more flexible display; for example, it is required to display different advertisements in each car.

When different advertisements are displayed on straps in each car, it is required to transmit information (car numbers) on the positions of cars to the straps. The position information may be transmitted by visible light communication that transmits information by superimposing the information on illumination light.

In the visible light communication using illumination light, each of illumination devices mounted on ceilings of cars transmits information on the position of the car on which the illumination device is mounted, by superimposing the information on light of the illumination device. The straps obtain the position information from the illumination devices mounted on the ceilings and display advertisements corresponding to the position information.

One advantage of visible light communication is that since visible light has directivity, interference is less likely to occur as compared with wireless communication. Thus, no interference occurs among the cars, which makes it possible to obtain proper position information.

Standards for visible light communication using illumination light include JEITA CP-1223. CP-1223 transmits information using a modulation method called PPM. PPM is a method that transmits information by mapping the information to the position of a pulse with a given width; in M-PPM, a symbol is divided into M slots, a pulse is placed at a position of a slot corresponding to information to be transmitted. FIG. 12 illustrates an example of 4-PPM when M=4. By turning off illumination light when a PPM signal is 1 and turning on the illumination light when the PPM signal is 0, it is possible to transmit information using the illumination light.

Since PPM keeps the ratio of 0 and 1 constant, it has an advantage that no flicker appears in illumination light on which information is superimposed.

CP-1223 is mainly used for transmission of data, such as ID or position information, having a small amount of information. Thus, it does not constantly transmit information, and a transmitted signal includes an invalid signal having no information.

A transmitted signal has a configuration in which there is an invalid signal for an indefinite period of time between frames for transmitting information (see FIG. 13); a frame consists of a known signal and 76 4-PPM symbols that are a data signal. The known signal has a unique sequence "111000000000" that does not appear in any PPM symbols and any invalid signals.

PPM maps information to the distance (time) from the head (symbol header) of a symbol to the position at which a pulse exists. For example, in 4-PPM, when information "00" is transmitted, a pulse is placed in the slot immediately after the symbol header of a symbol. When information "11" is transmitted, a pulse is placed in the slot farthest from the symbol header of a symbol. Thus, in demodulation for extracting information '0' or '1' from a symbol, it is required to accurately reproduce the position of the symbol header.

When a frame is transmitted, the transmission side first superimposes the known signal on illumination light and then superimposes 76 4-PPM symbols on the illumination light. At this time, a symbol time, which is a time interval at which 4-PPM symbols are transmitted, is measured on the basis of a clock.

Next, processing on a receiving side will be described. On the receiving side, a photodetector first converts the intensity of the illumination light into a voltage. Thereby, ON/OFF information of the illumination light is obtained as an electrical signal. Then, an A/D converter converts the voltage into discrete digital data (digital sampled values) on the basis of a sampling clock.

Further, a reference position detector detects the known signal in the sampled values sent from the A/D converter, and calculates, on the basis of the position of the detected known signal, the positions of the 76 symbol headers following the known signal.

Specifically, the position of the leading symbol header is determined from the position of the known signal, and the positions of the symbol headers existing at intervals of the symbol time are obtained on the basis of the determined position of the symbol header. At this time, since the number of samples per symbol time is equal to Ts×fs (where Ts is the symbol time, and fs is the frequency of the sampling clock), the position of the sample located Ts×fs samples ahead of the sample at the position of a symbol header is determined as the position of the next symbol header. Thus, the symbol time depends on the sampling clock.

However, in general, a clock of a product includes an error due to performance variations of components caused in the manufacturing process. Thus, the transmitting side symbol time measurement clock for measuring the symbol time on the transmitting side and the sampling clock for measuring the symbol time on the receiving side include errors. This causes a difference between the symbol time on the transmitting side and the symbol time on the receiving side.

Regarding a clock error that is a deviation of the clock on the transmitting side or the clock on the receiving side from a designed value, the transmitting side symbol time measurement clock, which is the clock on the transmitting side, and the sampling clock, which is the clock on the receiving side, will be considered.

FIG. 14 is a schematic diagram illustrating deviations of the positions of symbol headers due to a clock error in a prior art. As can be clearly seen from the diagram, the symbol time on the transmitting side derived from the transmitting side symbol time measurement clock and the symbol time on the receiving side derived from the sampling clock do not completely coincide with each other. Thus, it is difficult to make the positions of the symbol headers of 4-PPM symbols transmitted from the transmitting side and the positions of the symbol headers calculated on the receiving side accurately coincide with each other, and the deviation gradually increases.

The tolerance of data transmission rate in CP-1223 is permitted up to 0.5%, and it is considered that there is a clock error of up to ±0.5% on the transmitting side. Thus, a receiving device conforming to CP-1223 needs to detect and correct a clock error of ±0.5%.

As one of methods of detecting and correcting a clock error, there is a method of inserting a pilot signal for correcting a clock error into data to achieve accurate synchronization; however, there is a problem in that transmission efficiency decreases as the inserted pilot signal increases.

To solve the problem described above, as a conventional method, as illustrated in FIG. 15, there is a method of synchronizing symbol headers when the interval between pulses is one of given values, without inserting a pilot signal. In M-PPM, when the interval between pulses is 2×(M−1) slots, the preceding pulse is necessarily present in the first slot in a symbol, and the following pulse is necessarily present in the last slot in a symbol. Moreover, when two pulses are continuous, the preceding pulse is necessarily present in the last slot in a symbol, and the following pulse is necessarily present in the first slot in a symbol. The positions of the pulses in the symbols become clear, and thus the positions of the symbol headers are determined, so that the clock error can be corrected (see, for example, Patent Literature 1).

CITATION LIST

Patent Literature

Patent Literature 1: Japanese Patent Application Publication No. Hei 10-84337

SUMMARY OF INVENTION

Technical Problem

However, in the method described in Patent Literature 1, the clock error cannot be corrected unless the interval between two pulses is one of the given pulse intervals; the timing of correction of the clock error is irregular; the reliability of correction of the clock error is not sufficient.

Further, since the clock error is corrected using only two pulses, the correction cannot be performed when disturbance in pulse waveform due to noise occurs, and the tolerance to noise is not sufficient.

The present invention has been made to solve the problems described above, and is intended to provide a receiving device capable of performing detection and correction of a clock error with high reliability and sufficient tolerance to noise.

Solution to Problem

A receiving device according to the present invention includes: a receiver that receives a signal including a plurality of PPM symbols; a clock generator that generates a clock for sampling with respect to the signal received by the receiver; an A/D converter that digital-converts the received signal on a basis of the sampling; a reference position detector that detects a leading position of the PPM symbols on a basis of data from the A/D converter; and a clock error detector that detects a clock error, wherein the clock error detector includes: a pulse position detector that detects a pulse position in the PPM symbols on a basis of data from the reference position detector and the A/D converter; a pulse position error calculator that calculates a deviation of the pulse position on a basis of data from the reference position detector and the A/D converter and data from the reference position detector and the pulse position detector; and a clock error calculator that calculates the clock error on a basis of data from the pulse position error calculator, and wherein the receiving device varies a frequency of the clock generated by the clock generator, on a basis of data from the clock error calculator.

Advantageous Effects of Invention

According to the present invention, it is possible to provide a PPM receiving device and method capable of performing detection and correction of a clock error with high reliability and sufficient tolerance to noise.

BRIEF DESCRIPTION OF DRAWINGS

FIG. 7 is a diagram illustrating clock error detection according to a second embodiment of the present invention.

FIG. 8 is a conceptual diagram illustrating pattern determination according to the second embodiment of the present invention.

DESCRIPTION OF EMBODIMENTS

First Embodiment

Figure 1:
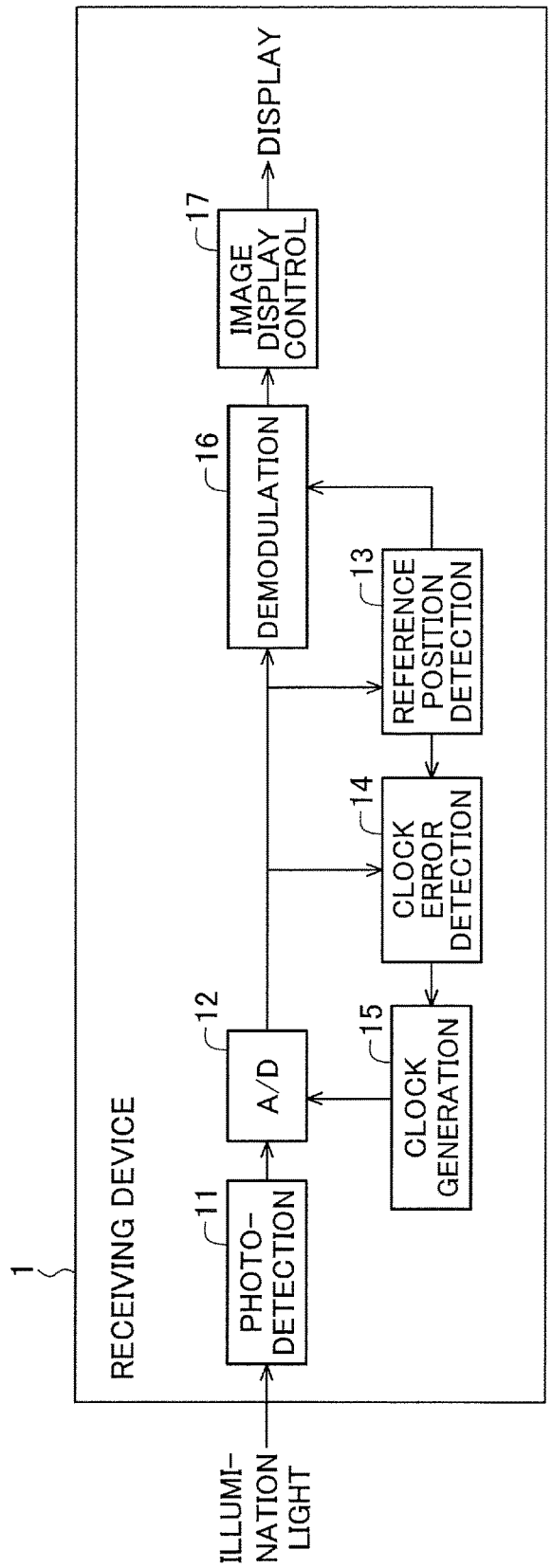
FIG. 1 is a diagram illustrating a configuration of a receiving device according to a first embodiment of the present invention.

Embodiments of the present invention will now be described with reference to the drawings. In the following description of the drawings, identical or similar parts are given identical or similar reference characters. It should be noted that the drawings are schematic and ratios of dimensions or the like are different from actual ones. Thus, specific dimensions or the like should be understood with reference to the following description. Dimensional relationships or ratios between portions may be different between the drawings.

FIG. 1 is a diagram illustrating a configuration of a receiving device according to a first embodiment of the present invention. In the diagram, the receiving device 1 includes a photodetector 11, an A/D converter 12, a reference position detector 13, a clock error detector 14, a clock generator 15, a demodulator 16, and an image display controller 17.

The photodetector 11 receives illumination light, converts it into a voltage value having a waveform inversely proportional to the intensity of the illumination light, and outputs it. Thus, the photodetector 11 outputs a waveform having a low voltage value when the illumination light is ON and a high voltage value when the illumination light is OFF.

Figure 2:
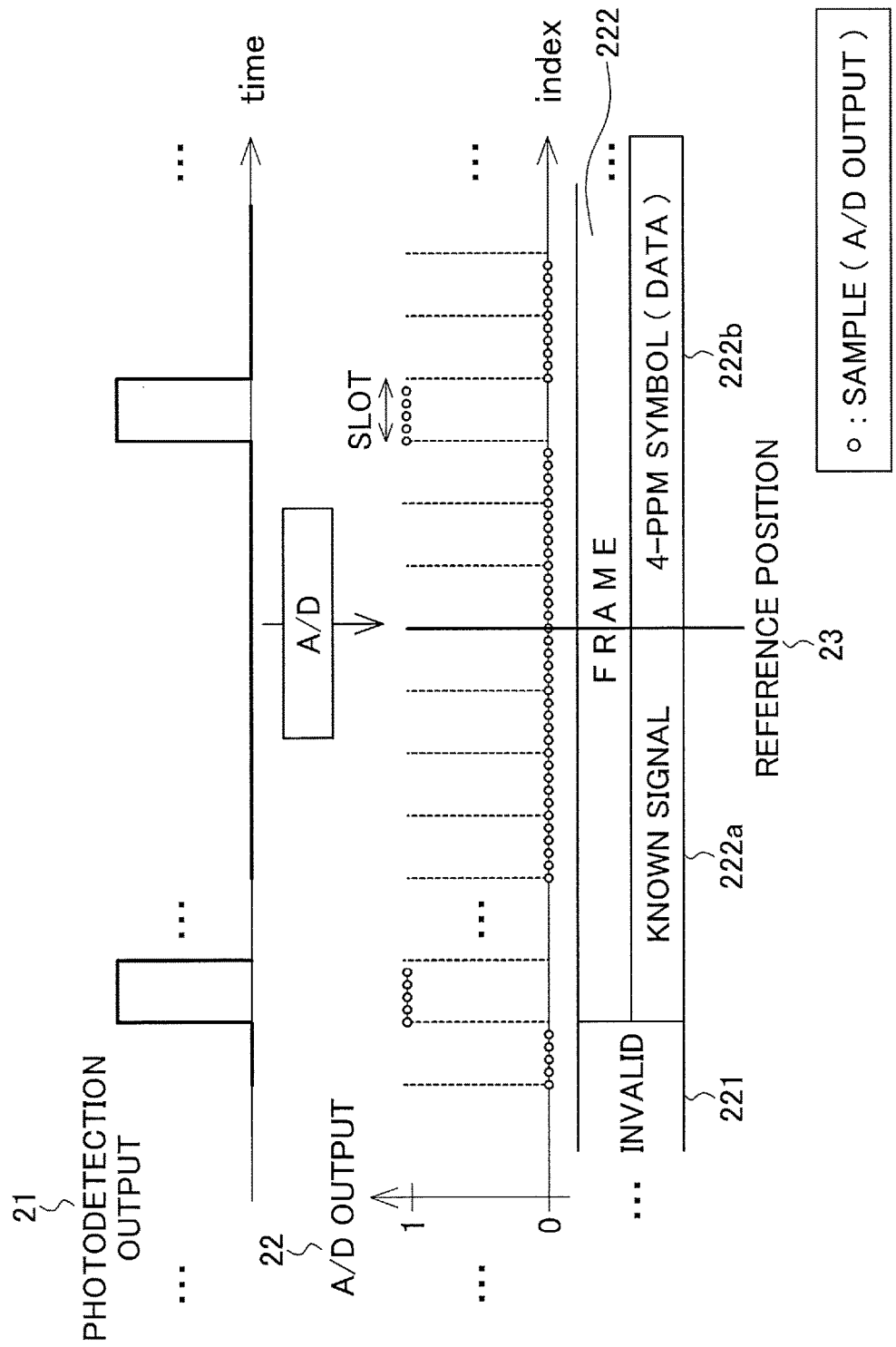
FIG. 2 is a diagram illustrating A/D conversion by the receiving device according to the first embodiment of the present invention.

FIG. 2 is a diagram illustrating A/D conversion by the receiving device according to the first embodiment of the present invention. As illustrated in the diagram, the A/D converter 12 performs A/D conversion on the voltage value supplied from the photodetector 11. Specifically, the A/D converter 12 performs sampling on the photodetection output voltage value 21 using a sampling clock such that the number of samples per slot is N, and converts it into discrete values, which are an A/D output 22. The sampling clock is supplied from the clock generator 15.

The A/D output 22 consists of a frame 222 having information, and an invalid signal 221 having no information. The frame 222 consists of a known signal 222a having a unique sequence, and 76 4-PPM symbols 222b.

The reference position detector 13 detects the known signal 222a in the A/D output 22, and outputs, as a reference position 23, the position of the sample following the detected known signal. The known signal 222a has the unique sequence, which does not appear in other transmitted signals. Thus, the reference position detector 13 can detect the known signal 222a by searching for the unique sequence in the A/D output 22. The reference position 23 is the position of the symbol header of the first PPM symbol in the frame (the position of the first sample in the symbol).

The clock error detector 14 detects a clock error calculation value on the basis of the A/D output 22 supplied from the A/D converter 12 and the reference position 23 supplied from the reference position detector 13.

Figure 3:
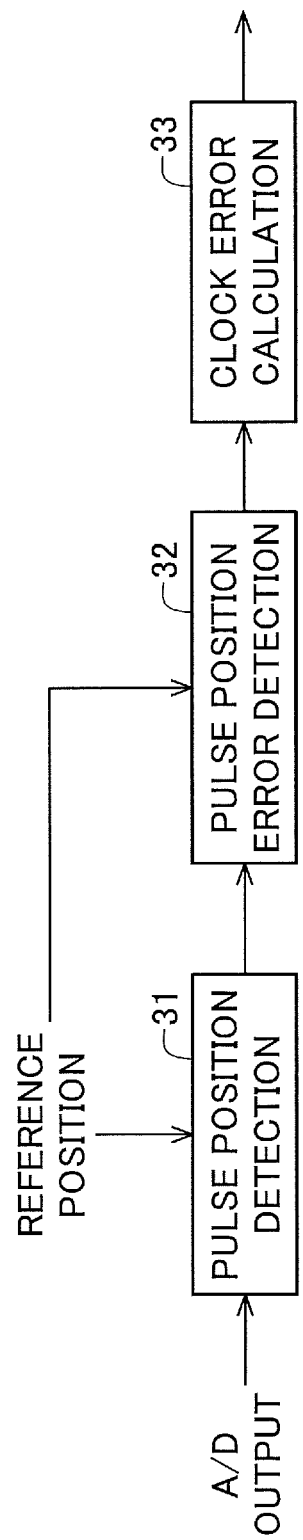
FIG. 3 is a diagram illustrating a configuration of a clock error detector of the receiving device according to the first embodiment of the present invention.

FIG. 3 is a diagram illustrating a configuration of the clock error detector of the receiving device according to the first embodiment of the present invention. In the diagram, the clock error detector 14 includes a pulse position detector 31, a pulse position error calculator 32, and a clock error calculator 33.

The pulse position detector 31 detects the positions of all the pulses in the 4-PPM symbols in the frame.

The frame has 76 4-PPM symbols. Thus, there are 304×N (=76 4-PPM symbols per frame×4 slots per 4-PPM symbol×N samples per slot) samples from the reference position 23 to the end of the frame 222. So, for example, the pulse position detector 31 performs fall determination on all the 304×N samples from the reference position 23 to the end of the frame 222, and detects, as pulse positions, positions at which falls occur.

In one method of determining a pulse fall position, the position of a sample is determined as a fall position when the difference between the value of the sample and the value of the preceding sample is equal to or greater than a predetermined value. Here, the "predetermined value" may be, for example, an average value of sample values.

The following relationship is satisfied:

$$Ns/2 \leq I \leq Ns$$

where I is the number of pulse fall positions in the frame detected by the pulse position detector 31, and Ns is the number of PPM symbols in the frame. PPM does not have two or more pulses in one symbol. Thus, $I \leq Ns$. When a pulse exists in the last slot of a symbol and a pulse exists in the first slot of the following symbol, the two pulses are continuous and no fall exists between the two pulses. Thus, $Ns/2 \leq I$.

The pulse position error calculator 32 receives information regarding the pulse fall positions output from the pulse position detector 31 and information regarding the reference position output from the reference position detector 13, and calculates errors in the pulse positions on the basis of these information items.

Figure 4:
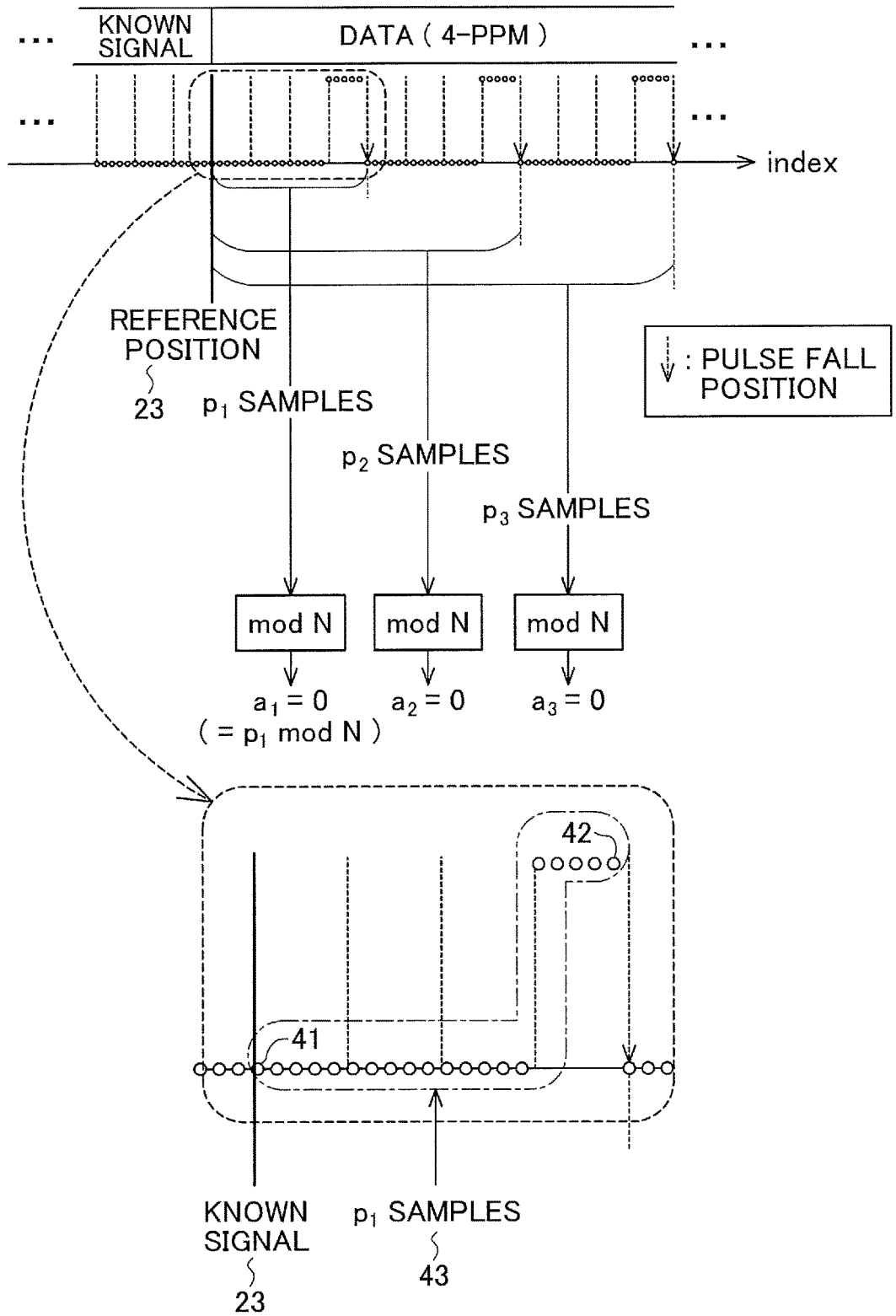
FIG. 4 is a schematic diagram illustrating a relationship between an output of an A/D converter of the receiving device according to the first embodiment of the present invention and fall positions.

FIG. 4 is a schematic diagram illustrating a relationship between an output of the A/D converter in the receiving device according to the first embodiment of the present invention and fall positions. The pulse position error calculator 32 calculates the numbers $p_i$ (i=1, 2, ..., I) of samples from the reference position 23 to the positions of the samples immediately before the pulse fall positions, and outputs the remainders $a_i = p_i \pmod{N}$ (i=1, 2, ..., I) obtained by dividing $p_i$ by the number N of samples per slot, as information indicating errors in the pulse positions.

For example, $p_1$ is the number 43 of samples existing from the sample 41 at the reference position 23 to the sample 42 immediately before the pulse fall position. At this time, the existing samples include the sample 41 at the reference position 23 and the sample 42 immediately before the pulse fall position.

Figure 5A:
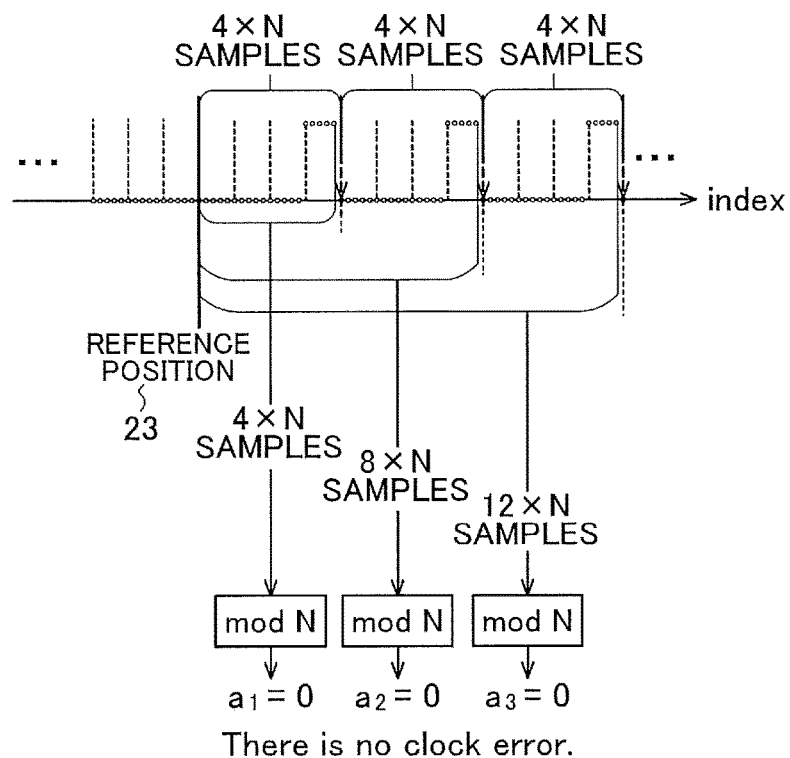
FIGS. 5a to 5c are schematic diagrams each illustrating a relationship of detection of pulse position errors depending on a clock error in the first embodiment of the present invention.
Figure 5B:
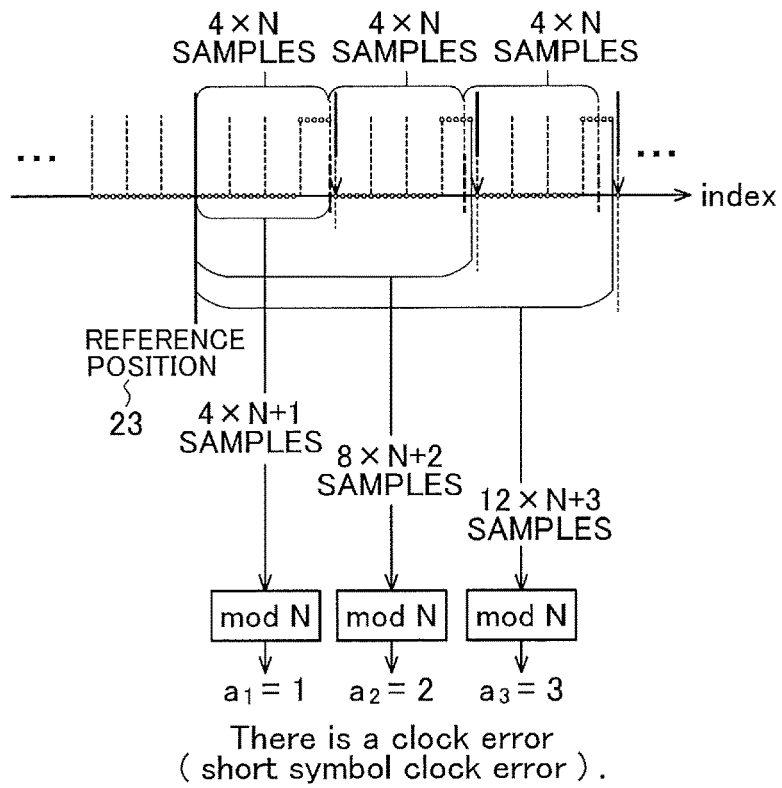
Figure 5C:
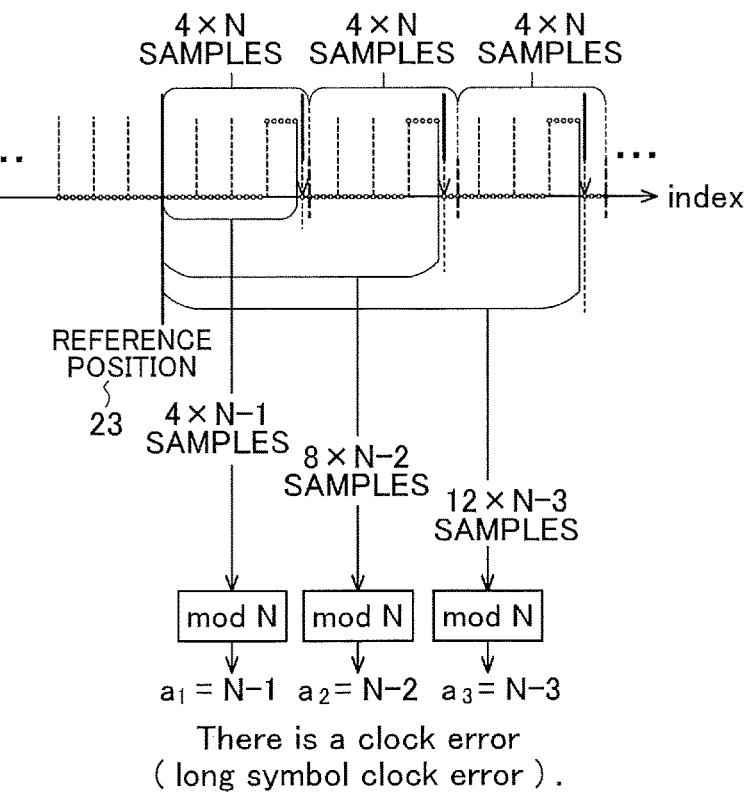
Figure 6A:
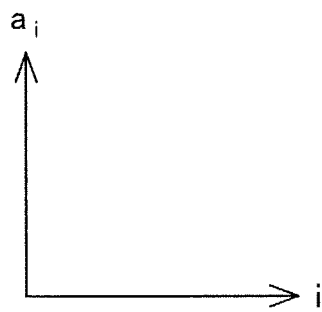
FIGS. 6a to 6c are schematic diagrams each illustrating a relationship of detected values of pulse position errors in the first embodiment of the present invention.
Figure 6B:
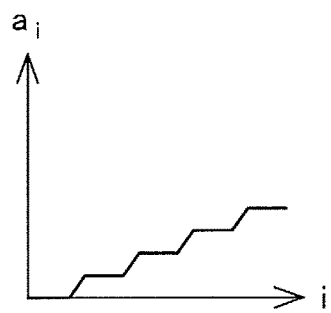
Figure 6C:
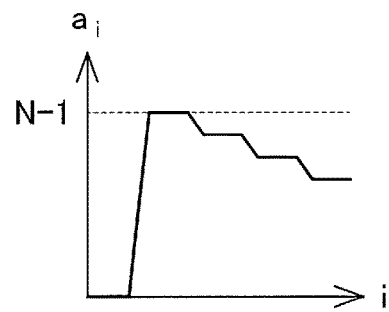

FIGS. 5 to 5c are schematic diagrams each illustrating a relationship between remainders obtained by dividing the numbers of samples from the reference position to the position of the samples immediately before pulse fall positions by N and errors in pulse positions. FIGS. 6a to 6c are graphs each indicating a clock error with i on the horizontal axis and $a_i$ on the vertical axis. When there is no clock error, $a_i = 0$ (i=1, 2, ..., I). This is because, since the A/D converter 12 performs sampling at a sampling clock frequency such that the number of samples per slot is N, the number of samples existing between a pulse fall position, which is a boundary between slots, and the reference position 23 is always a multiple of N (see FIG. 5a).

On the other hand, when there is a clock error on the transmitting side or receiving side, differences between the positions of symbol headers on the transmitting side and the positions of symbol headers on the receiving side appear in $a_i$.

As an example, a case will be considered in which there occurs a clock error (referred to below as a short symbol clock error) such that the symbol time on the receiving side is shorter than the symbol time on the transmitting side.

The symbol time on the transmitting side depends on the transmitting side symbol time measurement clock. On the other hand, the symbol time on the receiving side depends on the sampling clock. Thus, when there occurs a clock error such that the frequency of the transmitting side symbol time measurement clock on the transmitting side is small or the frequency of the sampling clock on the receiving side is large, the symbol time on the receiving side is shorter than the symbol time on the transmitting side.

The time from the reference position 23 to a fall depends on the transmitting side symbol time measurement clock. On the other hand, the number of samples existing from the reference position to a fall depends on the sampling clock. Thus, when the difference between the position of a symbol header on the transmitting side and the position of a symbol header on the receiving side is n sampling intervals, $a_i = n$ (mod N) (see FIG. 5b).

When a short symbol clock error occurs, since $a_i$ increases as i increases, an increasing stepped graph appears. The greater the clock error, the shorter the time until the difference between the position of a symbol header on the transmitting side and the position of a symbol header on the receiving side occurs, and the steeper the slope of the graph.

Also, when the clock error is great and the difference between the position of a symbol header on the transmitting side and the position of a symbol header on the receiving side becomes N sampling intervals, $a_i$ returns to zero. Thus, the graph shows a waveform in which an increasing stepped graph ranging from 0 to N−1 exists periodically. This is due to the (mod N) operation, and occurs when the clock error is great and the slope of the graph is steep (see FIG. 6b).

On the other hand, a case will be considered in which there occurs a clock error (referred to below as a long symbol clock error) such that the symbol time on the receiving side is longer than the symbol time on the transmitting side. When the frequency of the transmitting side symbol time measurement clock on the transmitting side is great due to an error or the frequency of the sampling clock on the receiving side is small due to an error, the symbol time on the receiving side is longer than the symbol time on the transmitting side.

When the difference between the position of a symbol header on the transmitting side and the position of a symbol header on the receiving side is n sampling intervals, $a_i = N - n$ (mod N) (see FIG. 5c).

FIG. 6c is a graph indicating a relationship when a long symbol clock error occurs, with i on the horizontal axis and $a_i$ on the vertical axis, and a decreasing stepped graph appears therein.

The clock error calculator 33 obtains a clock error calculation value on the basis of information regarding pulse position errors $a_i$ (i=1, 2, ..., I) calculated by the pulse position error calculator 32.

In one example, the clock error calculation value is obtained from the information regarding $a_i$ by the following method.

First, it is determined whether the type of clock error is the short symbol clock error or long symbol clock error. Regarding differential values (=$a_{i+1} - a_i$) of $a_i$ with respect to i (i=1, 2, ..., I), the number of positive values and the number of negative values are compared with each other; if the number of positive values is greater, it is determined that the type of clock error is the short symbol clock error; if the number of negative values is greater, it is determined that the type of clock error is the long symbol clock error; if the number of positive values and the number of negative values are equal to each other, it is determined that there is no clock error. By comparing between the number of positive differential values and the number of negative differential values, the method detects the slope of the graph as illustrated in FIGS. 6a to 6c and determines the type of clock error.

Next, the clock error calculation value is calculated using the following formula:

$$Ec = \begin{cases} \alpha \sum_{i=1}^{I} a_i & \text{(short symbol clock error)} \\ 0 & \text{(no clock error)} \\ \alpha \sum_{i=1}^{I} (a_i - (N-1)) & \text{(long symbol clock error)} \end{cases} \quad \text{(Formula 1)}$$

where Ec is the clock error calculation value.

Here, $\alpha$ is a weight added to the clock error calculation value and will be described in detail later.

The clock error calculation value is a positive value in the case of a short symbol clock error, and a negative value in the case of a long symbol clock error. The greater the magnitude of the clock error, the farther the clock error calculation value is away from zero; when there is no clock error, the clock error calculation value is zero.

Information regarding the clock error calculation value calculated by the clock error calculator 33 is supplied to the clock generator 15.

The clock generator 15 generates the sampling clock and outputs it to the A/D converter 12. The clock generator 15 also corrects the generated sampling clock in accordance with the clock error calculation value received from the clock error detector 14. The clock generator 15 decreases the frequency of the sampling clock when the clock error calculation value is a positive value, and increases the frequency of the sampling clock when the clock error calculation value is a negative value. The greater the absolute value of the clock error calculation value, the greater the amount of change in the frequency of the sampling clock.

By feeding back the information regarding the clock error calculation value detected by the clock error detector 14 to the clock generator 15, the frequency of the sampling clock is made closer to a predetermined value, and the clock error is decreased. At this time, the greater the value of $\alpha$, which is used in formula 1 and is the weight in the clock error calculation formula, the higher the rate of the correction of the clock error. However, since a larger correction is made in accordance with one clock error calculation value, tolerance to noise decreases. The smaller the value of $\alpha$, the lower the correction rate. However, tolerance to noise increases. The value of $\alpha$ need not be always constant. For example, the value of $\alpha$ may be initially great to make the correction rate high, and may be made small after the clock error detection is performed a predetermined number of times.

The above embodiment has described, as an example, a method that detects the clock error from pulse fall positions, but the clock error may be detected from pulse rise positions. It may also be detected using both falls and rises. The use of both falls and rises increases I, improving the accuracy of the clock error calculation value.

The demodulator 16 calculates, on the basis of information regarding the reference position supplied from the reference position detector 13, the positions of the symbol headers of the PPM symbols in the frame, and then demodulates the PPM symbols and detects the transmitted data.

The image display controller 17 selects, on the basis of data supplied from the demodulator 16, an image to be displayed, and displays it on a display.

For example, in a strap signage system provided in cars of a train or a bus, a system will be considered which transmits, to a strap, information (the car number) on the position of the car in which the strap is placed. The strap side displays an image corresponding to the received car number on a display provided on the strap. In this case, a table for selecting, on the basis of a car number, an image corresponding to the car number, and images to be displayed are stored in the receiving device in advance.

In the strap signage system, the transmitting side may transmit image data to be displayed on the display provided on the strap. The image display controller 17 of the receiving side simply outputs the image data supplied from the demodulator 16 to the display.

In the above Patent Literature 1, there is a problem in that the clock error correction cannot be performed until a signal having one of the given pulse intervals is received, and the reliability of the clock error correction is low. Further, since the clock error correction is performed using only two pulses, tolerance to disturbance in pulse waveform due to noise is low.

The receiving device according to the first embodiment of the present invention detects the clock error from pulses that always exist in a frame, and thereby can detect and correct the clock error even when no signal having a given pulse interval is coming, providing the advantage of improving the reliability of the clock error correction. Further, it detects the clock error from multiple pulses in a frame, thereby providing the advantage of improving the tolerance to disturbance in pulse waveform due to noise.

Second Embodiment

A receiving device according to a second embodiment of the present invention will be described below. The second embodiment has a configuration obtained by adding a pattern determiner to the clock error detector of the receiving device according to the above first embodiment.

FIG. 7 is a block diagram illustrating a configuration of a clock error detector of the receiving device in the second embodiment of the present invention. In the following, description of parts that are the same as those in the first embodiment will be omitted or simplified, and elements that are the same as or correspond to those in the first embodiment will be given the same reference characters.

In the diagram, the clock error detector of this embodiment includes a pulse position detector 71, the pulse position error calculator 32, the clock error calculator 33, and the pattern determiner 72, and is the same in configuration and function as that of the first embodiment, except for the pulse position detector 71 and pattern determiner 72.

The pattern determiner 72 determines a region where there is no pulse, on the basis of information regarding pulse positions supplied from the pulse position detector 71. After that, when the pulse position detector 71 performs detection of the presence or absence of a pulse in the region where there is no pulse, the pattern determiner 72 outputs an ENABLE signal indicating OFF to the pulse position detector 71. Otherwise, it outputs an ENABLE signal indicating ON.

The determination of a region where there is no pulse uses a property of PPM that there is only one pulse in a PPM symbol.

FIG. 8 is a conceptual diagram illustrating processing by the receiving device according to the second embodiment of the present invention. Hereinafter, description will be made with reference to the diagram.

A pattern 81 will be considered in which the difference between a pulse fall position supplied from the pulse position detector 71 and the preceding pulse fall position supplied from the pulse position detector 71 is two slots.

In the case of the pattern 81, there are two candidates for symbol header positions in FIG. 8: symbol header positions 82a and 82b (candidate A), and symbol header positions 83a and 83b (candidate B). If symbol headers were at positions other than the two candidates, no pulse or two or more pulses would be present in a symbol, which violates the property of PPM.

From the property of PPM, when symbol headers are at the symbol header positions 82a and 82b (candidate A), there is no fall within the region A 821. Likewise, when symbol headers are at the symbol header positions 83a and 83b (candidate B), there is no fall within the region B 831.

Thus, in the pattern 81, there is no fall within the region C 84 where the region A 821 and region B 831 overlap each other.

In consideration of the above, when pulse fall positions supplied from the pulse position detector 71 matches the pattern 81, the pattern determiner 72 determines the region C 84 to be a region where there is no fall. When the pulse position detector 71 performs detection of a fall within the region C 84, the pattern determiner 72 outputs an ENABLE signal indicating OFF to the pulse position detector 71.

Likewise, a region where there is no fall can also be found in a pattern in which the difference between two fall positions is three slots.

The pulse position detector 71 detects pulse positions. At this time, it performs ON/OFF control of the detection in accordance with the ENABLE signal supplied from the pattern determiner 72. Specifically, it performs the detection only when the ENABLE signal is ON, and performs no processing when the ENABLE signal is OFF.

In the receiving device according to the first embodiment, to detect a pulse position, the pulse position detector 31 performs the pulse detection over the entire range of a PPM symbol. In this embodiment, the pattern determiner 72 determines, from supplied pulse positions, the possibility of the presence of a pulse in a region where the pulse detection has not been performed; the pulse position detector 71 does not perform the detection within a region where there is no pulse. This provides the advantage that the amount of processing by the pulse position detector 71 is reduced.

This provides the advantage that the amount of processing by the pulse position detector 71 is reduced by about 10% on average and power consumption can be reduced, as compared with a case in which the pulse detection is performed over the entire range of a PPM symbol.

This embodiment determines, from detected pulse positions, the possibility of the presence of a pulse in a region where the pulse detection has not been performed, and does not perform the detection within a region where there is no pulse, thereby providing the advantage of allowing the processing amount of the pulse position detection to be reduced.

Third Embodiment

A receiving device according to a third embodiment of the present invention will be described below. The third embodiment has a configuration obtained by adding a clock error corrector to the receiving device according to the first embodiment, the clock error corrector supplying reception data to the demodulator.

Figure 9:
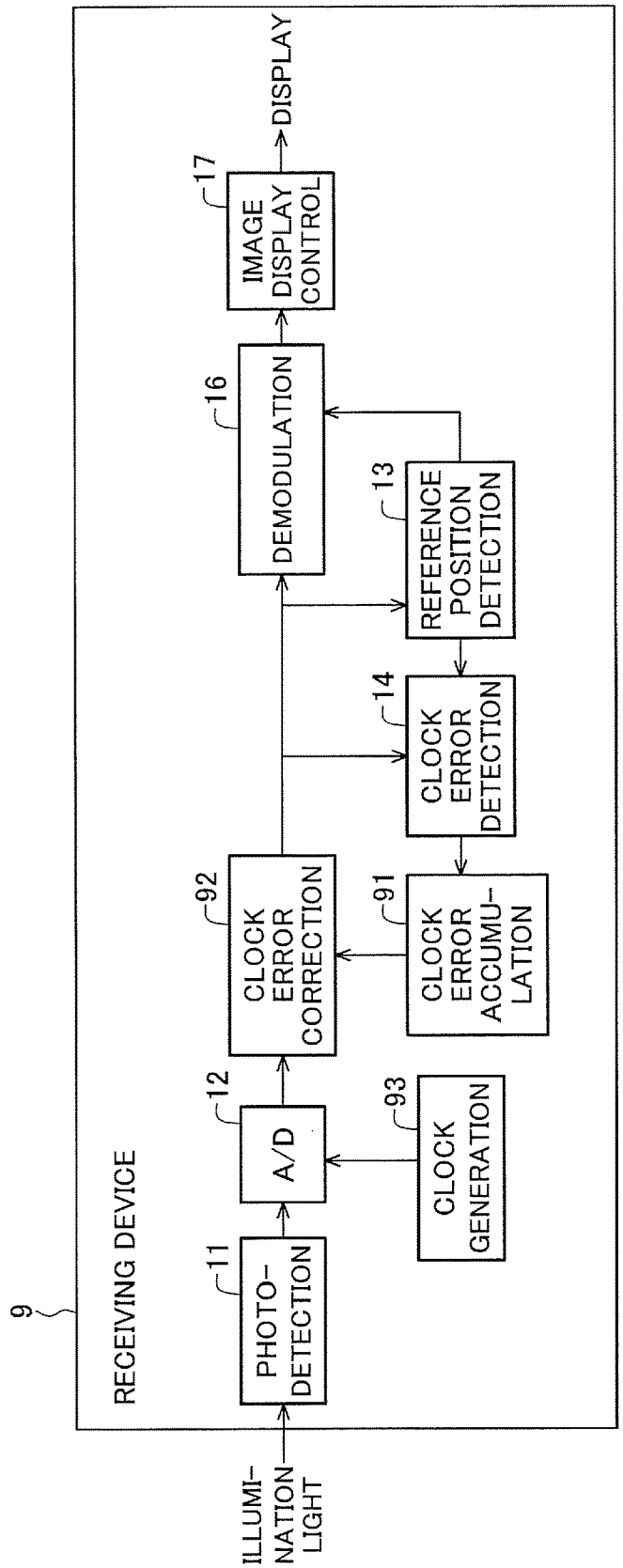
FIG. 9 is a diagram illustrating a receiving device according to a third embodiment of the present invention.

FIG. 9 is a block diagram illustrating a configuration of the receiving device of the third embodiment of the present invention. In the following, description of parts that are the same as those in the first embodiment will be omitted or simplified, and elements that are the same as or correspond to those in the first embodiment will be given the same reference characters.

In the diagram, the receiving device 9 includes the photodetector 11, the A/D converter 12, the reference position detector 13, the clock error detector 14, a clock generator 93, the demodulator 16, the image display controller 17, a clock error accumulator 91, and the clock error corrector 92.

The receiving device 9 is the same in configuration and function as that of the first embodiment, except for the clock generator 93, clock error accumulator 91, and clock error corrector 92.

The clock generator 93 generates a sampling clock having a frequency such that the number of samples per slot is N, and supplies it to the A/D converter 12.

The clock error accumulator 91 calculates, on the basis of information regarding the clock error calculation value supplied from the clock error detector 14, an accumulated value of the clock error calculation value, and supplies information regarding the result to the clock error corrector 92.

The clock error corrector 92 performs, on the basis of the information regarding the accumulated value of the clock error supplied from the clock error accumulator 91, clock error correction on the A/D output 22 by deletion or insertion of a sample, and supplies the correction result to the reference position detector 13, clock error detector 14, and demodulator 16.

When the accumulated value of the clock error is a positive value, one sample is deleted at predetermined intervals. When it is a negative value, one sample is inserted at predetermined intervals. The value indicated by an inserted sample is an average value of the values indicated by the samples adjacent to and on both sides of the insertion position.

The predetermined intervals at which the deletion or insertion of a sample is performed are proportional to the absolute value of the accumulated value of the clock error. The intervals decrease as the absolute value of the accumulated value of the clock error increases, and increase as the absolute value decreases.

By feeding back the information regarding the accumulated value of the clock error obtained by the clock error detector 14 and clock error accumulator 91 to the clock error corrector 92, the effect of the clock error to the output of the clock error corrector 92 is reduced.

Since the clock error is corrected by the clock error corrector 92, the clock generator 93 does not obtain the information regarding the clock error calculation value from the clock error detector 14, and does not perform the correction of the sampling clock in accordance with the clock error calculation value. Thus, even when the sampling clock frequency cannot be changed in the clock generator 93, the clock error can be corrected.

Unlike the first embodiment, the A/D conversion output is not supplied from the A/D converter 12 to the reference position detector 13, clock error detector 14, and demodulator 16, and instead, the signal subjected to the clock error correction is supplied from the clock error corrector 92.

This embodiment has the advantage that the clock error can be corrected even when the sampling clock frequency cannot be changed in the clock generator.

Fourth Embodiment

A receiving method of a receiving device according to a fourth embodiment of the present invention will be described below. The fourth embodiment has a configuration in which the reference position detector, clock error detector, demodulator, and image display controller of the receiving device according to the first embodiment are implemented by software.

Figure 10:
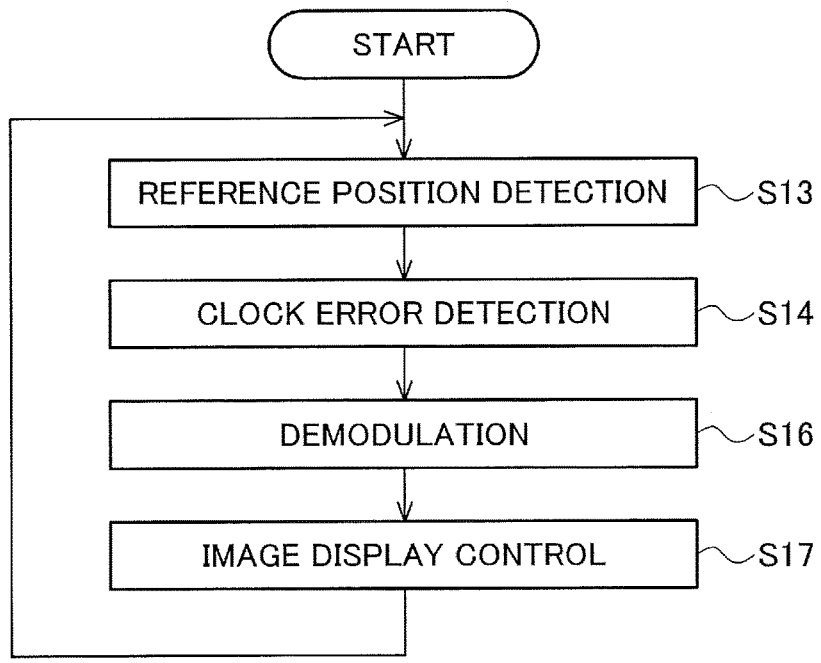
FIG. 10 is a flowchart illustrating the flow of processing by a software section according to a fourth embodiment of the present invention.

FIG. 10 is a flowchart illustrating a flow of processing by a software section of a receiving system of the fourth embodiment of the present invention. The embodiment of the present invention will now be described with reference to the diagram. In the following, description of parts that are the same as those in the first embodiment will be omitted or simplified, and elements that are the same as or correspond to those in the first embodiment will be given the same reference characters.

The receiving method of the receiving system of the fourth embodiment of the present invention includes a reception step of receiving a signal including multiple PPM symbols; a clock generation step of generating a clock for sampling with respect to the signal received in the reception step; and an A/D conversion step of digital-converting the received signal on the basis of the sampling. For clock error correction, the receiving method includes a reference position detection step S13 and a clock error detection step S14. For displaying an image, the receiving method further includes a demodulation step S16 and an image display control step S17.

The photodetector 11, A/D converter 12, and clock generator 15, which execute these steps, are the same in configuration and function as those in the first embodiment. However, data of the A/D output 22, which is an output of the A/D converter 12, is stored in a memory; in the clock error detection step S14, a clock error calculation value is supplied to the clock generator 15. Each step for the clock error correction will be described below.

The reference position detection step S13 is a step of detecting the known signal 222a in a signal from the memory in which the data of the A/D output 22 is stored, and outputting, as information on a reference position 23, the position of the sample following the detected known signal (see FIG. 2). A sequence (which is a pattern, and may be simply referred to below as the sequence) indicated by the known signal 222a includes the unique sequence, which does not appear in a substantial data part, which is another transmitted part. Thus, the reference position detection step S13 can detect the known signal 222a by searching for the unique sequence in the data of the A/D output 22. The reference position 23 is the position of the symbol header of the first PPM symbol in a frame (the position of the first sample in the symbol). The reference position detection step S13 is inactive when the information amount of data of the A/D output 22 stored in the memory is less than a predetermined amount, and is active when the information amount is greater than or equal to the predetermined amount. Thus, a wait is made until data of the A/D output 22 accumulates in the memory. Here, the "predetermined amount" may be, for example, the information amount of data of the A/D output 22 corresponding to two frames.

The clock error detection step S14 starts to operate after the reference position detection step S13 outputs information regarding the reference position 23, and is a step of detecting a clock error calculation value on the basis of the data of the A/D output 22 stored in the memory and the information regarding the reference position 23 supplied from the reference position detection step S13.

Figure 11:
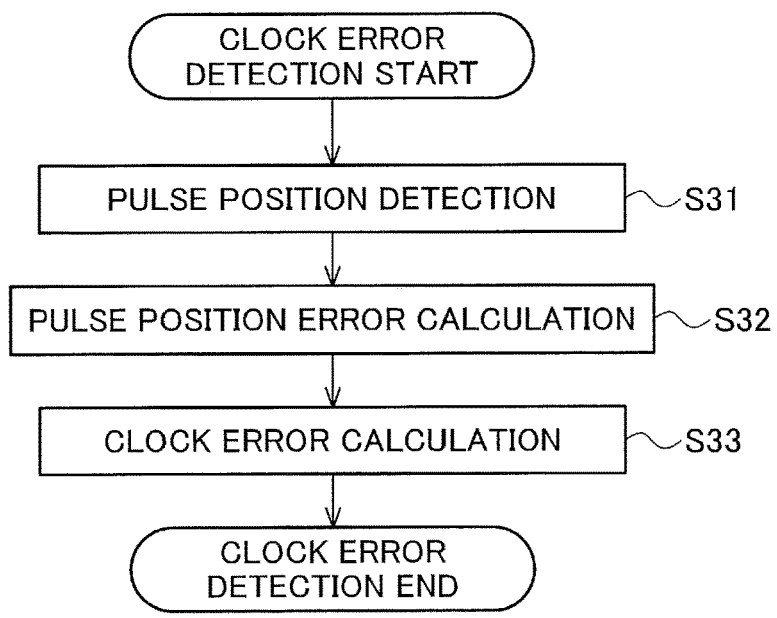
FIG. 11 is a flowchart illustrating the flow of clock error detection by the software section according to the fourth embodiment of the present invention.

FIG. 11 is a diagram illustrating a configuration of the clock error detection step in the receiving method according to the fourth embodiment of the present invention. In the diagram, the clock error detection step S14 includes a pulse position detection step S31, a pulse position error calculation step S32, and a clock error calculation step S33.

The pulse position detection step S31 is a step of detecting the positions of all the pulses in the 4-PPM symbols in a frame.

The frame has 76 4-PPM symbols. Thus, there are 304×N (=76 4-PPM symbols per frame×4 slots per 4-PPM symbol×N samples per slot) samples from the reference position 23 to the end of the frame 222. So, for example, the pulse position detection step S31 performs fall determination on all the 304×N samples from the reference position 23 to the end of the frame 222, and detects, as pulse positions, positions where falls occur.

For example, as a method of determining a pulse fall position, there is a method that determines the position of a sample as a fall position when the difference between the value of the sample and the value of the adjacent preceding sample is equal to or less than a predetermined value. Here, the "predetermined value" may be, for example, an average value of sample values.

The following relationship is satisfied:

$$Ns/2 \leq I \leq Ns$$

where I is the number of pulse fall positions in the frame detected in the pulse position detection step S31, and Ns is the number of PPM symbols in the frame. PPM does not have two or more pulses in a symbol. Thus, I≤Ns. When a pulse exists in the last slot of a symbol and a pulse exists in the first slot of the following symbol, the two pulses are continuous and one fall is lost. Thus, Ns/2≤I.

In the pulse position error calculation step S32, errors in the pulse positions are calculated from information regarding the pulse fall positions output in the pulse position detection step S31 and information regarding the reference position output in the reference position detection step S13.

Hereinafter, description will be made with reference to FIGS. 4 to 6 used in the first embodiment. In the diagrams, the pulse position error calculation step S32 calculates the numbers $p_i$ (i=1, 2, . . . , I) of samples from the reference position 23 to the positions of the samples immediately before pulse fall positions, and outputs the remainders $a_i = p_i$ (mod N) (i=1, 2, . . . , I) obtained by dividing $p_i$ by the number N of samples per slot, as information indicating errors in the pulse positions.

For example, $p_1$ is the number 43 of samples existing from the sample 41 at the reference position 23 to the sample 42 immediately before the pulse fall position. At this time, the existing samples include the sample 41 at the reference position and the sample 42 immediately before the pulse fall position.

When there is no clock error, $a_i = 0$ (i=1, 2, . . . , I). This is because, since the A/D converter 12 performs sampling at a sampling clock frequency such that the number of samples per slot is N, the number of samples existing between a pulse fall position, which is a boundary between slots, and the reference position 23 is always a multiple of N (see FIG. 5a).

On the other hand, when there is a clock error on the transmitting side or receiving side, differences between the positions of symbol headers on the transmitting side and the positions of symbol headers on the receiving side appear in $a_i$.

As an example, a case will be considered in which there occurs a clock error (referred to below as a short symbol clock error) such that the symbol time on the receiving side is shorter than the symbol time on the transmitting side.

The symbol time on the transmitting side depends on the transmitting side symbol time measurement clock. On the other hand, the symbol time on the receiving side depends on the sampling clock. Thus, when there occurs a clock error such that the frequency of the transmitting side symbol time measurement clock on the transmitting side is small or the frequency of the sampling clock on the receiving side is large, the symbol time on the receiving side is shorter than the symbol time on the transmitting side.

The time from the reference position 23 to a fall depends on the transmitting side symbol time measurement clock. On the other hand, the number of samples existing from the reference position to a fall depends on the sampling clock. Thus, when the difference between the position of a symbol header on the transmitting side and the position of a symbol header on the receiving side is n sampling intervals, $a_i = n$ (mod N) (see FIG. 5b).

In the case of a short symbol clock error, since $a_i$ increases as i increases, an increasing stepped graph appears. The greater the clock error, the shorter the time until the difference between the position of a symbol header on the transmitting side and the position of a symbol header on the receiving side occurs, and the steeper the slope of the stepped graph.

Also, when the clock error is great and the difference between the position of a symbol header on the transmitting side and the position of a symbol header on the receiving side becomes N sampling intervals, $a_i$ returns to zero. Thus, the graph shows a waveform in which an increasing stepped graph ranging from 0 to N−1 exists periodically. This is due to the (mod N) operation, and occurs when the clock error is great and the slope of the stepped graph is steep (see FIG. 6b).

On the other hand, a case will be considered in which there occurs a clock error (referred to below as a long symbol clock error) such that the symbol time on the receiving side is longer than the symbol time on the transmitting side. When the frequency of the transmitting side symbol time measurement clock is great due to an error or the frequency of the sampling clock on the receiving side is small due to an error, the symbol time on the receiving side is longer than the symbol time on the transmitting side.

When the difference between the position of a symbol header on the transmitting side and the position of a symbol header on the receiving side is n sampling intervals, $a_i = N − n$ (mod N) (see FIG. 5c).

FIG. 6c is a graph indicating a relationship in the case of a long symbol clock error, with i on the horizontal axis and $a_i$ on the vertical axis, and a decreasing stepped graph appears therein.

The clock error calculation step S33 obtains a clock error calculation value on the basis of information regarding pulse position errors $a_i$ (i=1, 2, . . . , I) calculated in the pulse position error calculation step S32.

In one example, the clock error calculation value is obtained from the information regarding $a_i$ by the following method.

First, it is determined whether the type of clock error is the short symbol clock error or long symbol clock error. Regarding differential values ($=a_{i+1} − a_i$) of $a_i$ with respect to i (i=1, 2, . . . , I), the number of positive values and the number of negative values are compared with each other; if the number of positive values is greater, it is determined that the type of clock error is the short symbol clock error; if the number of negative values is greater, it is determined that the type of clock error is the long symbol clock error; if the number of positive values and the number of negative values are equal to each other, it is determined that there is no clock error. By comparing between the number of positive differential values and the number of negative differential values, the method detects the slope of the graph as illustrated in FIGS. 6a to 6c and determines the type of clock error.

Next, the clock error calculation value is calculated using the following formula.

$$Ec = \begin{cases} \alpha \sum_{i=1}^{I} a_i & \text{(short symbol clock error)} \\ 0 & \text{(no clock error)} \\ \alpha \sum_{i=1}^{I} (a_i - (N-1)) & \text{(long symbol clock error)} \end{cases} \quad \text{(Formula 2)}$$

where Ec is the clock error calculation value.

Here, $\alpha$ is a weight added to the clock error calculation value and will be described in detail later.

The clock error calculation value is a positive value in the case of a short symbol clock error, and a negative value in the case of a long symbol clock error. The greater the magnitude of the clock error, the farther the clock error calculation value is away from zero; when there is no clock error, the clock error calculation value is zero.

Information regarding the clock error calculation value calculated in the clock error calculation step S33 is supplied to the clock generator 15.

The clock generator 15 generates the sampling clock and outputs it to the A/D converter 12. The clock generator 15 also corrects the generated sampling clock in accordance with the clock error calculation value received from the clock error detection step S14. The clock generator 15 decreases the frequency of the sampling clock when the clock error calculation value is a positive value, and increases the frequency of the sampling clock when the clock error calculation value is a negative value. The greater the absolute value of the clock error calculation value, the greater the amount of change in the frequency of the sampling clock.

By feeding back the information regarding the clock error calculation value detected in the clock error detection step S14 to the clock generator 15, the frequency of the sampling clock is made closer to a predetermined value, and the clock error is decreased. At this time, the greater the value of $\alpha$, which is used in formula 1 and is the weight in the clock error calculation formula, the higher the rate of the correction for the clock error. However, since a larger correction is made on the basis of one clock error calculation value, tolerance to noise decreases. The smaller the value of $\alpha$, the lower the correction rate. However, tolerance to noise increases. The value of $\alpha$ need not be always constant. For example, the value of $\alpha$ may be initially great to make the correction rate high, and may be made small after the clock error detection is performed a predetermined number of times.

The above embodiment has described, as an example, a method that detects the clock error from pulse fall positions, but the clock error may be detected from pulse rise positions. It may also be detected using both falls and rises. The use of both falls and rises increases I, improving the accuracy of the clock error calculation value.

The demodulation step S16 calculates, on the basis of information regarding the reference position supplied from the reference position detection step S13, the positions of the symbol headers of the PPM symbols in the frame, and then demodulates the PPM symbols and detects the transmitted data.

The image display control step S17 selects, on the basis of data supplied from the demodulation step S16, an image to be displayed, and displays it on a display.

For example, in a strap signage system provided in cars of a train or a bus, a system will be considered which transmits, to a strap, information (the car number) on the position of the car in which the strap is placed. The strap side displays an image corresponding to the received car number on a display provided on the strap. In this case, a table for selecting, on the basis of a car number, an image corresponding to the car number, and images to be displayed are stored in the receiving device in advance.

In the strap signage system, the transmitting side may transmit an image to be displayed on the display provided on the strap. The image display control step S17 on the receiving side simply outputs the image supplied from the demodulation step S16 to the display.

In the above Patent Literature 1, there is a problem in that the clock error correction cannot be performed until a signal having one of the given pulse intervals is received, and the reliability of the clock error correction is low. Further, since the clock error correction is performed using only two pulses, tolerance to disturbance in pulse waveform due to noise is low.

The receiving method of the receiving device according to the fourth embodiment of the present invention detects the clock error from pulses that always exist in a frame, and thereby can detect and correct the clock error even when no signal having a given pulse interval is coming, providing the advantage of improving the reliability of the clock error correction. Further, it detects the clock error from multiple pulses in a frame, thereby providing the advantage of improving the tolerance to disturbance in pulse waveform due to noise.

Fifth Embodiment

A transmitting/receiving system according to a fifth embodiment of the present invention will be described below. The transmitting/receiving system according to this embodiment includes a transmitting device described in this embodiment and a receiving device described in the above embodiments. The transmitting device used in this embodiment will be described below. The configuration of the receiving device has been described, so description thereof will be omitted here.

Figure 16:
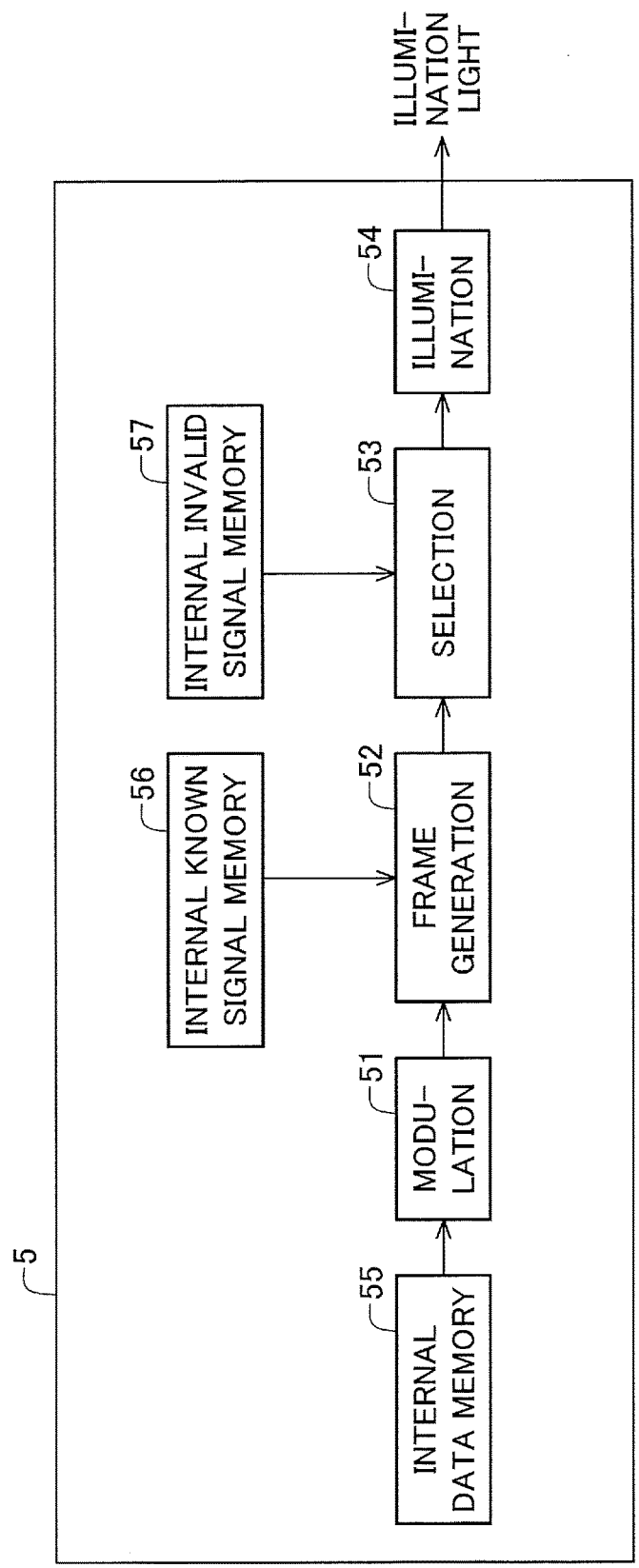
FIG. 16 is a diagram illustrating a configuration of a transmitting device according to a fifth embodiment of the present invention.

FIG. 16 is a diagram illustrating a configuration of the transmitting device used in the transmitting/receiving system according to the fifth embodiment of the present invention. In the diagram, the transmitting device 5 includes a modulator 51, a frame generator 52, a selector 53, an illuminator 54, an internal data memory 55, an internal known signal memory 56, and an internal invalid signal memory 57. For simplicity, this embodiment describes a configuration having separate memories for data, the known signal, and the invalid signal, but these data items may be stored in one or two common memories.

The transmitting device 5 outputs illumination light on which information is superimposed. The receiving device receives the illumination light and performs processing described in the above embodiments.

For transmission, the transmitting device 5 needs to be placed so that the illumination light, which is the output, reaches the receiving device.

The modulator 51 reads, from the internal data memory 55, a predetermined amount of data stored in the internal data memory 55 of the transmitting device 5, modulates the data by 4-PPM scheme, and supplies the modulation result to the frame generator 52.

The internal data memory 55 functions to hold information to be transmitted from the transmitting device 5 to the receiving device, and supplies data on request. The data is previously stored in the internal data memory 55. When an image is transmitted, the data stored in the internal data memory 55 is image data.

The modulator 51 repeats read, modulation, and output of data stored in the internal data memory 55. The amount of data read by the modulator 51 at a time is, for example, 64 bits. The visible light communication standard JEITA CP-1223 generates and transmits a frame for every 64 bits of data. Reading data from the memory on a 64-bit basis makes it possible to generate a signal conforming to JEITA CP-1223. The frame will be described later together with the frame generator 52.

Figure 12:
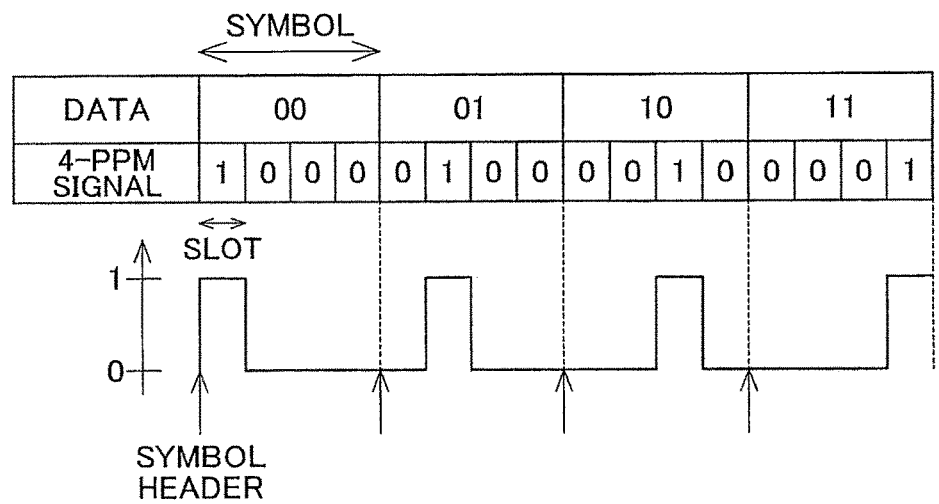
FIG. 12 is a conceptual diagram illustrating a conventional 4-PPM modulation method.
Figure 13:
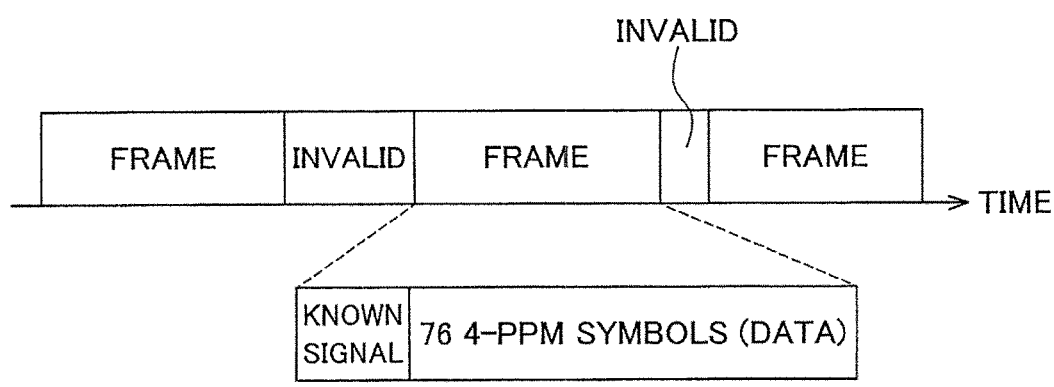
FIG. 13 is a diagram illustrating a configuration of a transmitted signal of the present invention.
Figure 14:
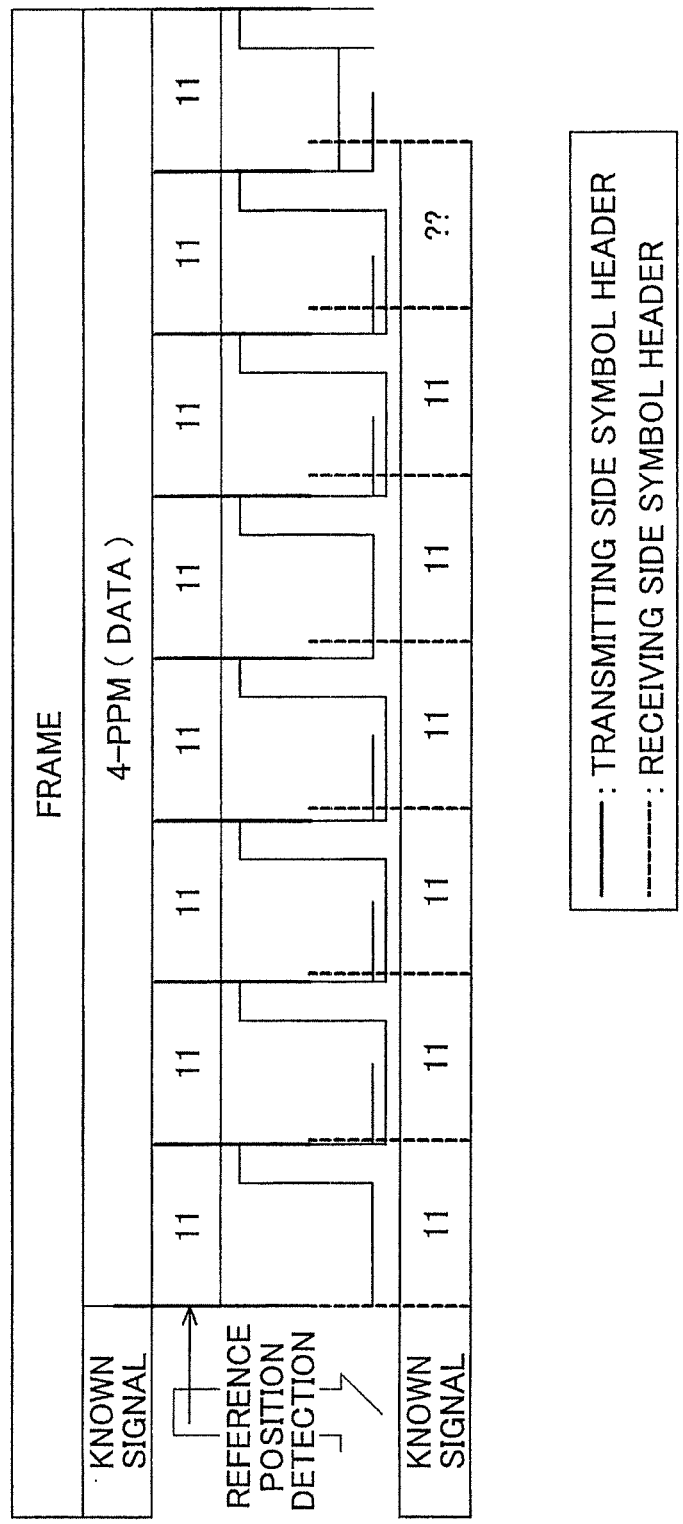
FIG. 14 is a conceptual diagram illustrating deviations of the positions of symbol headers due to a clock error.
Figure 15:
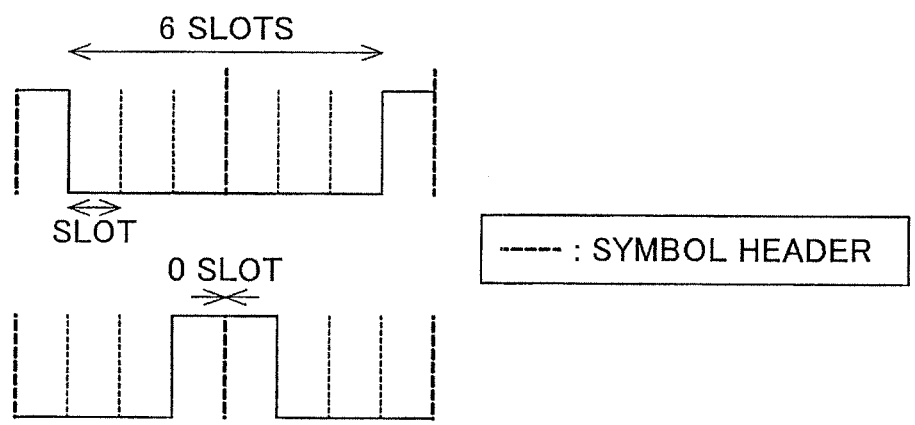
FIG. 15 is a conceptual diagram illustrating the positions of pulses of a clock error correction method in a conventional receiving device.

The modulation result is represented by the 4-PPM signals illustrated in FIG. 12, and consists of a sequence of '0' and '1'.

The internal known signal memory 56 functions to hold the known signal used by the frame generator 52, and supplies the known signal on request. The known signal is previously stored in the internal known signal memory 56.

The frame generator 52 receives the modulation result supplied from the modulator 51, generates a frame on the basis of the received modulation result and the known signal stored in the internal known signal memory 56 of the transmitting device 5, and supplies it to the selector 53.

The frame consists of the known signal having the unique sequence, and the modulation result received from the modulator 51 at a time. The frame has a configuration in which the modulation result follows the known signal.

The known signal consists of '0' and '1', and has the unique sequence that does not appear in the modulation result. The unique sequence enables the frame to be detected by the receiving device.

The selector 53 receives the frame supplied from the frame generator 52, and supplies illumination ON/OFF information to the illuminator 54 on the basis of the received frame and the invalid signal stored in the internal invalid signal memory 57 of the transmitting device 5.

The selector 53 stores the frame received from the frame generator 52 in a buffer in the selector 53. The frame consists of a sequence of '0' and '1'. The selector 53 determines the values in the frame in the buffer one bit at a time from the beginning; it supplies the illuminator 54 illumination-OFF information if the value is '0' and illumination-ON information if the value is '1'. The time interval at which determination of 1 bit is made and illumination ON/OFF information is supplied is always constant.

The transmission rate depends on the time interval at which the selector 53 supplies illumination ON/OFF information.

When the selector 53 finishes the determination of the values until the end of the frame, it discards the frame in the buffer. Simultaneously, the selector 53 reads the invalid signal stored in the internal invalid signal memory 57 one bit at a time from the beginning; it supplies the illuminator 54 illumination-OFF information if the value is '0' and illumination-ON information if the value is '1'.

Reading the invalid signal continues until the selector 53 receives a next frame from the frame generator 52.

The internal invalid signal memory 57 functions to hold the invalid signal, and supplies the invalid signal on request. The invalid signal is previously stored in the internal invalid signal memory 57.

The invalid signal consists of '0' and '1', and has a sequence that may appear in the modulation result. It has no unique sequence like the known signal, which prevents the receiving device from erroneously detecting a frame.

The illuminator 54 has a function of outputting illumination light, and varies the output of the illumination light in accordance with the illumination ON/OFF information supplied from the selector 53.

The illuminator 54 outputs illumination light when it receives an illumination ON signal from the selector 53, and outputs no illumination light when it receives an illumination OFF signal.

The transmitting/receiving system according to this embodiment detects the clock error from pulses that always exist in a frame, and thereby can detect and correct the clock error even when no signal having a given pulse interval is coming, providing the advantage of improving the reliability of the clock error correction. Further, it detects the clock error from multiple pulses in a frame, thereby providing the advantage of improving the tolerance to disturbance in pulse waveform due to noise.

Sixth Embodiment

A transmitting/receiving system according to a sixth embodiment of the present invention will be described. The transmitting/receiving system according to this embodiment includes a transmitting device described in this embodiment and a receiving device described in the above embodiments.

Figure 17:
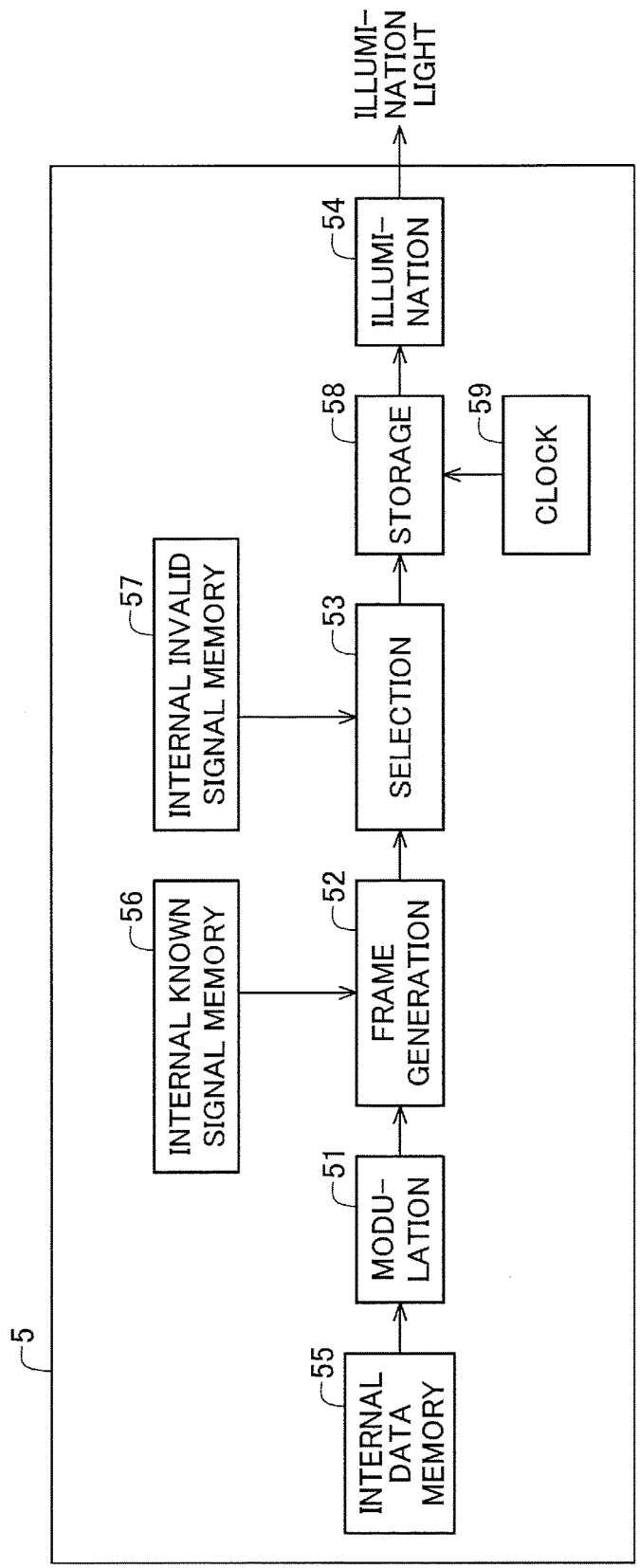
FIG. 17 is a diagram illustrating a configuration of a transmitting device according to a sixth embodiment of the present invention.

FIG. 17 is a block diagram illustrating a configuration of the transmitting device of this embodiment. The configuration is the same as in the fifth embodiment, except for a storage unit 58 and a clock unit 59, which are newly provided.

The illuminator 54, storage unit 58, and clock unit 59 perform processing by hardware, and the others perform processing by software.

The storage unit 58 and clock unit 59 used in this embodiment will be described below. The elements except for the storage unit 58 and clock unit 59 have been already described, so descriptions thereof will be omitted here.

The clock unit 59 supplies a clock to the storage unit 58. The frequency of the clock is a frequency with a period that is the same as the period at which the selector 53 outputs illumination ON/OFF information.

The storage unit 58 outputs illumination ON/OFF information received from the selector 53 to the illuminator 54 in synchronization with the clock received from the clock unit 59.

The selector 53 performs processing by software, and the storage unit 58, clock unit 59, and illuminator 54 perform processing by hardware. The selector 53, which performs processing by software, cannot supply illumination ON/OFF information at precise time intervals as compared to the clock supplied by the clock unit 59, due to the effect of other interrupt processes. Thus, the times at which illumination ON/OFF information is outputted by the selector 53 fluctuate.

The storage unit 58 supplies the output to the illuminator 54 in synchronization with the clock received from the clock unit 59. This reduces the effect of the fluctuation included in the output of the selector 53, so that it becomes possible to reduce fluctuation of the times at which the illumination light output by the illuminator 54 is switched between ON and OFF.

The transmitting/receiving system according to this embodiment supplies the illumination ON/OFF information supplied from software to the illuminator in synchronization with the clock, thereby reducing the effect of the fluctuation in the times of the output from the software and providing the advantage that it is possible to transmit illumination light having precise ON/OFF switching with less fluctuation.

REFERENCE SIGNS LIST 1 receiving device
11 photodetector
12 A/D converter
13 reference position detector
14 clock error detector
15 clock generator
16 demodulator
17 image display controller
21 photodetection output voltage value
22 A/D output
221 invalid signal
222 frame
222a known signal
222b 4-PPM symbols
23 reference position
31 pulse position detector
32 pulse position error calculator
33 clock error calculator
41 sample at reference position
42 sample immediately before pulse fall position
43 number of samples
71 pulse position detector
72 pattern determiner
81 pattern
82a, 82b candidate A for symbol header positions
821 region A
83a, 83b candidate B for symbol header positions
831 region B
84 region C
9 receiving device
91 clock error accumulator
92 clock error corrector
93 clock generator
S13 reference position detection step
S14 clock error detection step
S16 demodulation step
S17 image display control step
S31 pulse position detection step
S32 pulse position error calculation step
S33 clock error calculation step
5 transmitting device
51 modulator
52 frame generator
53 selector
54 illuminator
55 internal data memory
56 internal known signal memory
57 internal invalid signal memory
58 storage unit
59 clock unit

The invention claimed is:

1. A receiving device comprising:
a receiver that receives a signal including a plurality of PPM symbols;
a clock generator that generates a clock for sampling with respect to the signal received by the receiver;
an A/D converter that digital-converts the received signal on a basis of the sampling;
a reference position detector that detects a leading position of the PPM symbols on a basis of data from the A/D converter; and
a clock error detector that detects a clock error,
wherein the clock error detector includes:
a pulse position detector that detects a pulse position in the PPM symbols on a basis of data from the reference position detector and the A/D converter;
a pulse position error calculator that calculates a deviation of the pulse position on a basis of data from the reference position detector, the A/D converter, and the pulse position detector; and
a clock error calculator that calculates the clock error on a basis of data from the pulse position error calculator, and
wherein the receiving device varies a frequency of the clock generated by the clock generator, on a basis of data from the clock error calculator.

2. The receiving device of claim 1, wherein the clock error detector further includes a pattern determiner that detects a region in which there is no pulse, on a basis of data from the pulse position detector, and
wherein the pulse position detector performs no pulse search in a predetermined region related to the region in which there is no pulse, on a basis of data from the pattern determiner.

3. The receiving device of claim 2, further comprising a demodulator that, after the detection of the leading position of the PPM symbols, demodulates the PPM symbols on a basis of data from the reference position detector.

4. The receiving device of claim 3, further comprising:
a clock error accumulator that obtains an accumulated value of the clock error on a basis of data from the clock error detector; and
a clock error corrector that performs sample insertion or deletion on an output of the A/D converter, on a basis of data from the clock error accumulator,
wherein the clock generator does not vary the frequency of the clock for sampling, and
wherein the reference position detector, the clock error detector, and the demodulator perform processing on a basis of data from the clock error corrector without using data from the A/D converter.

5. The receiving device of claim 1, further comprising a demodulator that, after the detection of the leading position of the PPM symbols, demodulates the PPM symbols on a basis of data from the reference position detector.

6. The receiving device of claim 5, further comprising:
a clock error accumulator that obtains an accumulated value of the clock error on a basis of data from the clock error detector; and
a clock error corrector that performs sample insertion or deletion on an output of the A/D converter, on a basis of data from the clock error accumulator,
wherein the clock generator does not vary the frequency of the clock for sampling, and
wherein the reference position detector, the clock error detector, and the demodulator perform processing on a basis of data from the clock error corrector without using data from the A/D converter.

7. A receiving method comprising:

a reception step of receiving a signal including a plurality of PPM symbols;

a clock generation step of generating a clock for sampling with respect to the signal received in the reception step;

an A/D conversion step of digital-converting the received signal on a basis of the sampling;

a reference position detection step of detecting a leading position of the PPM symbols on a basis of data obtained in the A/D conversion step; and a clock error detection step of detecting a clock error, wherein the clock error detection step includes:

a pulse position detection step of detecting a pulse position in the PPM symbols on a basis of data obtained in the reference position detection step and the A/D conversion step;

a pulse position error calculation step of calculating a deviation of the pulse position on a basis of data obtained in the reference position detection step, the A/D conversion step, and the pulse position detection step; and a clock error calculation step of calculating the clock error on a basis of data obtained in the pulse position error calculation step, and wherein the receiving method varies a frequency of the clock generated in the clock generation step, on a basis of data obtained in the clock error calculation step.

8. A transmitting/receiving system comprising:

a transmitter that transmits a signal including a plurality of PPM symbols;

a receiver that receives the signal transmitted from the transmitter;

a clock generator that generates a clock for sampling with respect to the signal received by the receiver;

an A/D converter that digital-converts the received signal on a basis of the sampling;

a reference position detector that detects a leading position of the PPM symbols on a basis of data from the A/D converter;

a clock error detector that detects a clock error;

a demodulator that, after the detection of the leading position of the PPM symbols, demodulates the PPM symbols on a basis of data from the reference position detector;

an image display controller that controls a display image on a basis of data from the demodulator; and a display that displays the display image, wherein the clock error detector includes:

a pulse position detector that detects a pulse position in the PPM symbols on a basis of data from the reference position detector and the A/D converter;

a pulse position error calculator that calculates a deviation of the pulse position on a basis of data from the reference position detector, the A/D converter, and the pulse position detector; and a clock error calculator that calculates the clock error on a basis of data from the pulse position error calculator, and wherein the transmitting/receiving system varies a frequency of the clock generated by the clock generator, on a basis of data from the clock error calculator.

* * * * *